United States Patent
Hung et al.

(10) Patent No.: US 10,164,766 B1
(45) Date of Patent: Dec. 25, 2018

(54) ADVANCED SYNCHRONIZATION SCHEMES FOR NFC CARD EMULATION MODE, PEER-TO-PEER MODE AND RFID TAG DESIGN

(71) Applicant: Maxim Integrated Products, Inc., San Jose, CA (US)

(72) Inventors: Chen-Hsien Hung, Dallas, TX (US); Tao Huang, Plano, TX (US); Shiau Chwun George Pwu, Frisco, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 15/280,875

(22) Filed: Sep. 29, 2016

Related U.S. Application Data

(60) Provisional application No. 62/235,973, filed on Oct. 1, 2015.

(51) Int. Cl.
*H04L 7/033* (2006.01)
*H04L 7/00* (2006.01)
*H04B 5/00* (2006.01)
*G06K 19/07* (2006.01)

(52) U.S. Cl.
CPC .......... *H04L 7/0331* (2013.01); *H04L 7/0091* (2013.01); *G06K 19/0723* (2013.01); *H04B 5/0031* (2013.01); *H04B 5/0062* (2013.01)

(58) Field of Classification Search
CPC . H03L 7/099; H03L 7/07; H03L 7/089; H03L 7/08; H03L 7/0807; H04L 7/0331; H04L 7/0091; G06K 19/0723; G06K 17/0025; H04B 5/0031; H04B 5/0062; H04B 7/2125
See application file for complete search history.

(56) References Cited

U.S. PATENT DOCUMENTS 6,624,668 B1  9/2003  Robinson et al.
6,650,720 B1  11/2003  Grung et al.
(Continued)

FOREIGN PATENT DOCUMENTS

JP   H09130239 A   5/1997

*Primary Examiner* — Sophia Vlahos
(74) *Attorney, Agent, or Firm* — North Weber & Baugh LLP

(57) ABSTRACT

A start-up control for a transmitter (TX) output driver is implemented to prevent the stick state problem when the TX driver is not toggling. TX output driver is set in a high impedance (HZ) mode when data zero is delivered from the digital base band (DBB) and set in an enhanced mode to deliver a stronger signal when data one is delivered from the DBB. The transmitter comprises a dual-loop PLL to synchronize the TX output pulse and the carrier. The dual-loop PLL is composed of a relaxation oscillator, a $1^{st}$ Loop, and a $2^{nd}$ Loop. The $1^{st}$ loop is a voltage-controlled oscillator comprising the relaxation oscillator and an operational transconductance amplifier. The $2^{nd}$ loop is a loop comprising a phase frequency detector, a charge pump, a loop filter and the VCO of the $1^{st}$ loop.

18 Claims, 3 Drawing Sheets

(56) References Cited

U.S. PATENT DOCUMENTS

| | | | |
|---|---|---|---|
| 2005/0052208 A1* | 3/2005 | Starr | H03L 7/0812 327/156 |
| 2008/0164955 A1* | 7/2008 | Pfeiffer | H03B 5/1231 331/117 R |
| 2009/0137218 A1* | 5/2009 | Honda | H04B 1/44 455/127.1 |
| 2010/0197349 A1* | 8/2010 | Morita | G06K 7/10237 455/558 |
| 2010/0202421 A1* | 8/2010 | Price | H03G 3/3047 370/337 |
| 2010/0252631 A1* | 10/2010 | Kargl | G06K 7/0008 235/444 |
| 2010/0316173 A1* | 12/2010 | Giard | H03G 3/3089 375/345 |
| 2014/0273830 A1* | 9/2014 | Wong | H04B 5/0031 455/41.1 |
| 2014/0323043 A1 | 10/2014 | Shana'a et al. | |

\* cited by examiner

ADVANCED SYNCHRONIZATION SCHEMES FOR NFC CARD EMULATION MODE, PEER-TO-PEER MODE AND RFID TAG DESIGN

CROSS REFERENCE TO RELATED APPLICATION

This application claims the benefit under 35 U.S.C. § 119(e) of Provisional Patent Application No. 62/235,973, entitled "Advanced Synchronization Schemes for NFC Card Emulation Mode, Peer-To-Peer Mode and RFID Tag Design" naming as inventors, Cheng-Hsien Hung, Tao Huang, and Shiau Chwun George Pwu, and filed Oct. 1, 2015, which application is hereby incorporated herein by reference in its entirety.

BACKGROUND

A. Technical Field

The present invention relates generally to transmitter and receiver used for Internet of Things (IOT), more specifically relates to synchronization schemes in active card emulation mode or active tag design for near field communication (NFC) and Radio Frequency Integrated Circuit (RFIC) application.

B. Background of the Invention

The Internet of Things (IOT) is the network of physical objects or "things" embedded with electronics, software, sensors, and connectivity to enable objects to exchange data with the production, operator and/or other connected devices. IOT allows objects to be sensed and controlled remotely across existing network infrastructure, creating opportunities for more direct integration between the physical world and computer-based systems, and resulting in improved efficiency, accuracy and economic benefit.

In IOT applications, power amplifiers are widely used in transmitter (TX) circuit to generate the signal pulse from Card (Emulated) to increase the carrier amplitude to enhance the amplitude modulation received by reader receiver (RX), when TX delivers I/O signal.

To synchronize the incoming carrier with the TX output pulse, higher system clock for over sampling may be required, which consumes large power and complex the TX/RX design. Even by using the recovery clock from the carrier, which is generated by the reader, the delay from the capture block in RX to the driver stage in TX will still cause the phase mismatch over PVT corners. Signal (with mismatch) generated by TX will be detected by the capture block in RX, contaminating the recovery system. In some bad system design, the loop from RX to TX and back to RX could induce unexpected oscillation in the system.

Stick state of the TX driver with tied power or ground will short the AC signal (carrier) and eliminate the incoming signal (carrier) received by RX capture block, when TX driver is not toggling. Higher signal power is required to start up the recovery system and toggle the TX output drivers, which limits the communication distance significantly. A free running VCO may be chosen after synchronization for RX in the card emulation mode and P2P mode. However, a free running VCO phase noise cannot be filtered out by phase lock loop (PLL) or any other loops, and thus will degrade the entire system performance.

It would be desirable to have a synchronization scheme dealing with the synchronization and start-up problems in card emulation mode or tag (PICC) design for near field communication (NFC) and Radio Frequency Integrated Circuit (RFIC) application.

SUMMARY OF THE INVENTION

Embodiments of the invention relate to synchronization schemes in active card emulation mode or active tag design for NFC/RFIC application and method for its implementation.

In various embodiments, a start-up control for a transmitter (TX) output driver is implemented to prevent the stick state problem when the TX driver is not toggling. The TX comprises a power amplifier to amplify an output signal from a digital baseband (DBB). The output signal comprises binary bits of 0 and 1. When data zero (binary bits of 0) are delivered from the digital baseband (DBB), the power amplifier is set in a high impedance (HZ) mode (amplifier floating). When data one (binary bits of 1) are delivered from the DBB, the power amplifier is set at a low power with a first setting (such as a lowest possible power setting) at the first clock cycle of data one interval to start up, and then is set at an enhanced power with a second power setting higher than the first setting to deliver an amplified signal during the rest clock cycles of data one interval. Such an HZ mode setup during data zero intervals is necessary to prevent interference between the TX and Recovery Clock.

In some embodiments, a received signal strength indicator (RSSI) detector may be incorporated within the power amplifier 130 to adjust the power setting based on the strength of the incoming signal as an implementation of Automatic Power Control (APC).

In various embodiments, the transmitter comprises a dual-loop synchronization system (or a dual-loop PLL) to synchronize the TX output pulse and the carrier. The dual-loop PLL comprises a relaxation oscillator, a Type 1 Locked Loop ($1^{st}$ Loop), and a Type 2 Phase Locked Loop ($2^{nd}$ Loop). In some embodiments, the $1^{st}$ loop is a voltage-controlled oscillator (VCO) comprising the relaxation oscillator and an operational transconductance amplifier (OTA). The $2^{nd}$ loop is a loop comprising a phase frequency detector (PFD), a charge pump (CP), a loop filter (LP) and the VCO of the $1^{st}$ loop.

The phase noise of the relaxation oscillator is filtered out by the $1^{st}$ Loop, which is activated always. The $2^{nd}$ Loop locks the phase and the frequency of the oscillator with the carrier (recovery clock). The $2^{nd}$ Loop is activated only during the data zero periods. During the initial period and the data zero period, TX output is not enabled (HZ mode), and both loops (1st and 2nd loops) are activated in order to lock the frequency and the phase between TX clock and the incoming carrier.

In some embodiments, when the TX power amplifier (PA) is activated, the $2^{nd}$ loop is deactivated. The frequency and the phase of the relaxation oscillation are kept at their previous states. The PFD of the $2^{nd}$ loop is disabled to open the loop. Consequently, the oscillation is not impacted by TX output, since the recovery clock is not taken during this period. The $1^{st}$ loop is still activated to filter out the phase noise generated by the relaxation oscillator.

In some embodiments, TX output is not enabled during a locking process. An additional buffer tracking the delay of the TX driver is incorporated between the VCO and the PFD. When the TX is enabled, the $2^{nd}$ locking loop is deactivated with the PFD disabled. The oscillation is kept its previous state and the phase during data one period to prevent the interference from the TX output driver.

The Dual-Loop Synchronization system can synchronize the clock in tag/slave and reader/master by the 2nd loop of the system during the period when the TX of the tag/slave does not transmit power, thus alleviating the Center Frequency Offset (CFO) between reader (Master/PCD) and tag (Slave/PICC), which is one of the biggest issues in wireless communication design and may ruin the entire communication without receiving any data.

In some embodiments, during the TX mode when tag/slave need to reply to reader/master, the $2^{nd}$ loop is disabled (open) to prevent the self-interference. The $1^{st}$ loop is still activated to guarantee low phase noise to transmit the data.

BRIEF DESCRIPTION OF THE DRAWINGS

Reference will be made to exemplary embodiments of the present invention that are illustrated in the accompanying figures. Those figures are intended to be illustrative, rather than limiting. Although the present invention is generally described in the context of those embodiments, it is not intended by so doing to limit the scope of the present invention to the particular features of the embodiments depicted and described.

One skilled in the art will recognize that various implementations and embodiments of the invention may be practiced in accordance with the specification. All of these implementations and embodiments are intended to be included within the scope of the invention.

DETAILED DESCRIPTION OF THE PREFERRED EMBODIMENTS

In the following description, for the purpose of explanation, specific details are set forth in order to provide an understanding of the present invention. The present invention may, however, be practiced without some or all of these details. The embodiments of the present invention described below may be incorporated into a number of different electrical components, circuits, devices, and systems. Structures and devices shown in block diagram are illustrative of exemplary embodiments of the present invention and are not to be used as a pretext by which to obscure broad teachings of the present invention. Connections between components within the figures are not intended to be limited to direct connections. Rather, connections between components may be modified, re-formatted, or otherwise changed by intermediary components.

When the specification makes reference to "one embodiment" or to "an embodiment", it is intended to mean that a particular feature, structure, characteristic, or function described in connection with the embodiment being discussed is included in at least one contemplated embodiment of the present invention. Thus, the appearance of the phrase, "in one embodiment," in different places in the specification does not constitute a plurality of references to a single embodiment of the present invention.

Various embodiments of the invention are used for synchronization schemes in active card emulation mode or active tag design for a transmitter to communicate with a reader in NFC/RFIC application and a method for its implementation. The transmitter may be referred as a proximity inductive coupling card (PICC), a near field communication (NFC) tag, or an NFC device that can be read or written by a proximity reader. The transmitter may work in a card emulation mode or a peer to peer mode. The reader may be also referred as a proximity coupling device (PCD), which emits an electromagnetic field (or a carrier) that powers a tag/transmitter by inductivity coupling. The transmitter may be powered by electromagnetic induction from the reader and then enabled to transfer information to the reader.

Figure 1:
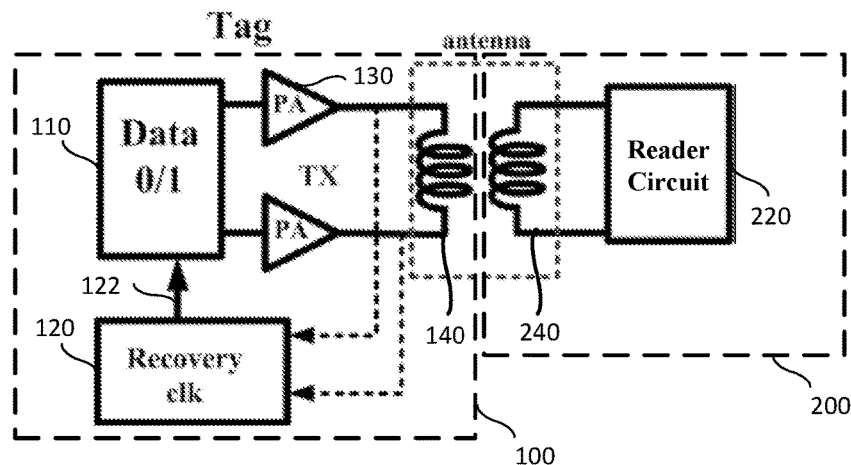
FIG. 1 is a schematic diagram of a transmitter (TX) in communication with a reader according to various embodiments of the invention.

FIG. 1 shows a schematic diagram of a transmitter (TX) 100 in communication with a reader 200 according to various embodiments of the invention. The transmitter (TX) 100 comprises a digital baseband (DBB) 110, a recovery clock circuit 120, a power amplifier 130 and a transmitter antenna 140. The reader 200 comprises a reader circuit 220 and a reader antenna 240. The transmitter (TX) 100 and the reader 200 communicate with each other via coupling between the transmitter antenna 140 and the reader antenna 240. The transmitter (TX) 100 and the reader 200 are able to receive and transmit data at the same time. Thus, they may check for potential collisions if the received signal frequency does not match with the transmitted signal's frequency. The digital baseband 110 may incorporate a storage unit (e.g. a non-volatile memory) to store data such as transmitter identification information, Personal Identification Numbers, contacts, etc. Typically, the data are read only, but may be rewriteable.

In operation, the reader 200 transmits a carrier 222 (shown in FIG. 2) through the reader antenna 240. The carrier 222 is typically at a frequency of 13.56 MHz. The transmitter (TX) 100 may be a passive transmitter drawing its operating power from the electromagnetic field of the carrier 222. The transmitter (TX) 100 receives the carrier and extracts a recovery clock signal 122 from the carrier via the recovery clock circuit 120. The recovery clock signal 122 is fed into the digital baseband 110 to synchronize the TX output and the carrier. The digital baseband 110 outputs a signal 112 comprising binary bits and the signal 112 is amplified by the power amplifier 130 according to an amplification setup based at least on the binary bits states. The power amplifier 130 outputs an amplified signal 132, which is transmitted through the transmitter antenna 140.

Figure 2:
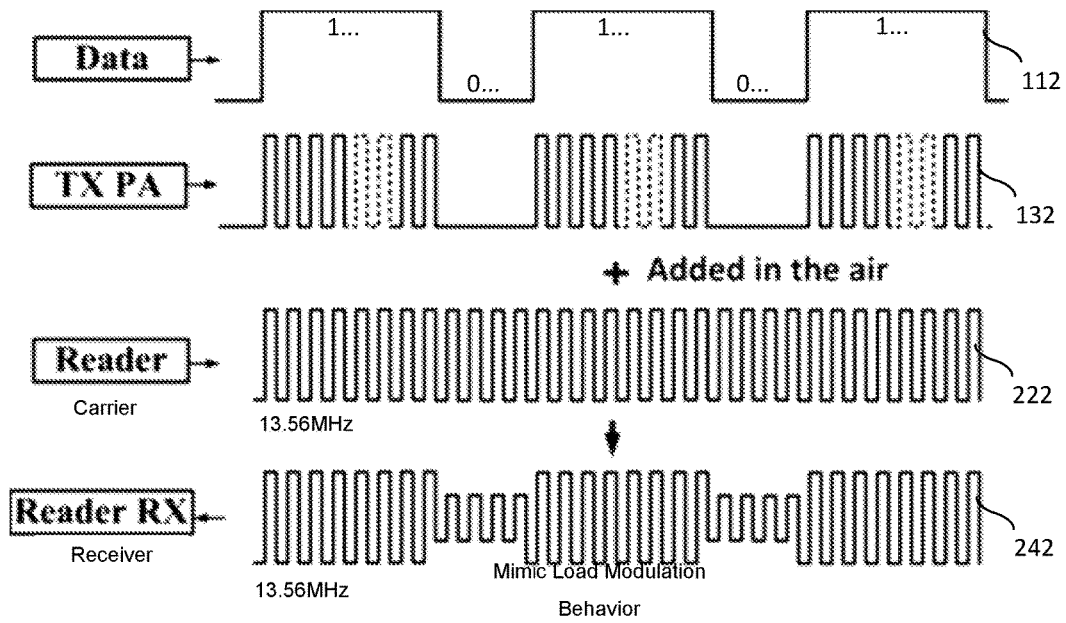
FIG. 2 is exemplary signal waveforms of the transmitter and the reader according to various embodiments of the invention.

FIG. 2 is exemplary signal waveforms of the transmitter and the reader according to various embodiments of the invention. Signal 222 is the carrier sent by the reader 200. The baseband 110 outputs the signal 112 comprising binary bits of 0 and 1. The binary bits are sent sequentially with each bit occupying at least one clock period of the recovery clock signal 122. The power amplifier 130 generates an amplified signal 132, which is transmitted via the transmitter antenna 140. The reader 200 receives a reader receiving signal 242, which is the combination of the signal 132 and the carrier signal 222.

When data zero (binary bits of 0) are delivered from the DBB 110, the power amplifier 130 is set in a high impedance (HZ) mode (amplifier floating). When data one (binary bits of 1) are delivered from the DBB 110, the power amplifier 130 is set at a low power with a first setting (such as a lowest possible power setting) at the first clock cycle of data one interval to start up and then is set at an enhanced power (with power setting higher than the first setting) to deliver an amplified signal during the rest clock cycles of data one interval. Such an HZ mode is necessary to prevent interference between the TX and Recovery Clock.

In some embodiments, a received signal strength indicator (RSSI) detector may be incorporated within the power amplifier 130 to adjust the power setting based on the strength of the incoming signal as an implementation of Automatic Power Control (APC).

Figure 3:
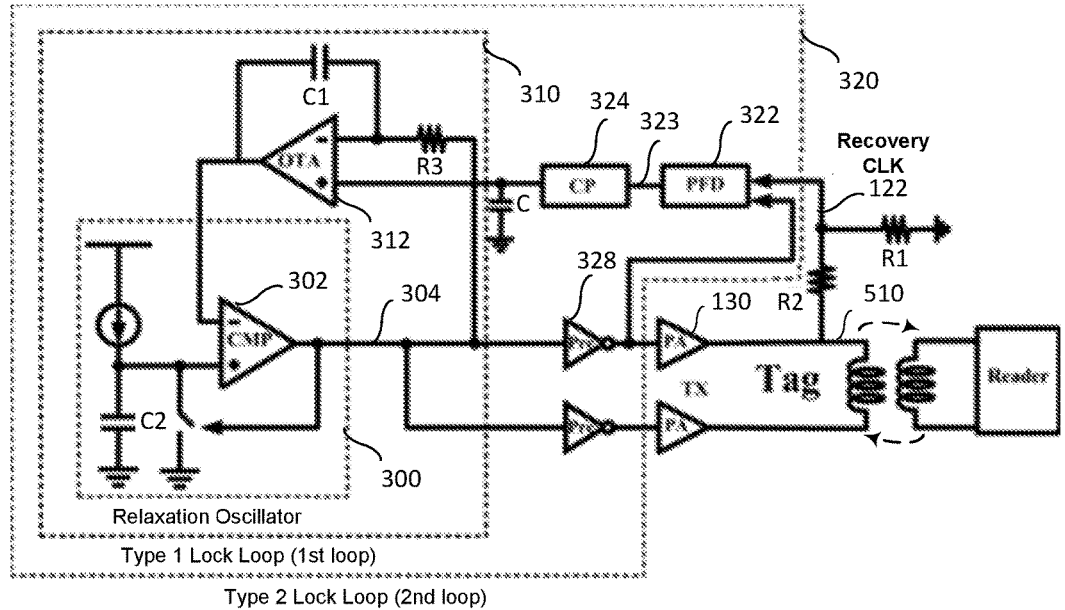
FIG. 3 is a dual-loop synchronization system within the transmitter for synchronization the TX output pulse and the carrier according to various embodiments of the invention.

FIG. 3 is a dual-loop synchronization system (or a dual-loop phase lock loop PLL) within the transmitter for synchronization the TX output pulse and the carrier according to various embodiments of the invention. The system utilizes a relaxation oscillator 300, a first loop 310 and a second loop 320 to synchronize the TX output signal and the carrier. In one embodiment, the relaxation oscillator 300 is a comparator-based hysteretic oscillator created by positive feedback loop implemented for a comparator 302. The output of the comparator 302 is fed back into a positive input of the comparator 302 to create a hysteretic oscillation.

The $1^{st}$ loop 310 is created by positive feedback implementation with the output 304 of the comparator 302 is fed back into a negative input of the comparator 302 via an operational transconductance amplifier (OTA) 312. The relaxation oscillator 300 and the OTA 312 altogether make the $1^{st}$ loop 310 functioning as a voltage-controlled oscillator (VCO), which is enabled always to filter out phase noise from the relaxation oscillator and thus provide good phase noise performance.

The $2^{nd}$ loop is formed by feeding the output 304 from the relaxation oscillator 300 back into a positive input of the OTA 312 via at least a phase frequency detector (PFD) 322 and a charge pump (CP) 324. Optionally, the output 304 from the relaxation oscillator 300 is sent to a pre-amplifier 328 before being fed into an input of the (PFD) 322. The PFD 322 receives input from the reference clock signal 122 and the relaxation oscillator output 304. The PFD output 323 is used to control the VCO such that the phase difference between the two inputs is held constant.

Figure 4:
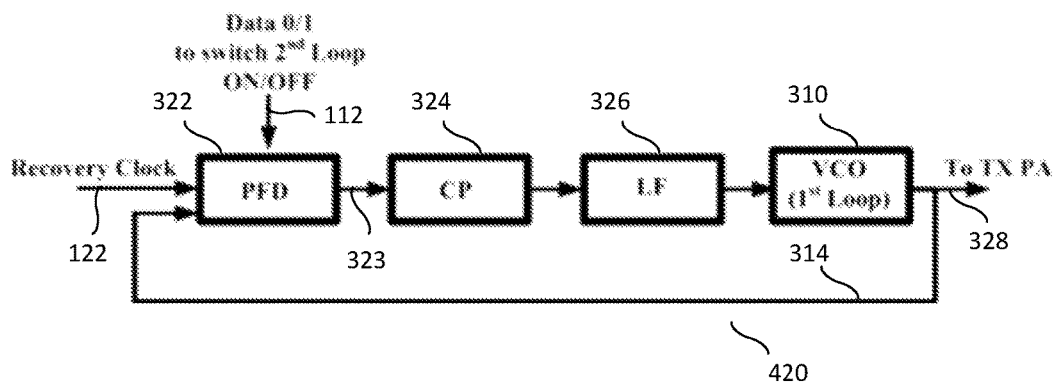
FIG. 4 is an exemplary schematic diagram of a second loop of the dual-loop synchronization system according to various embodiments of the invention.

FIG. 4 shows another exemplary schematic diagram of a second loop of the dual-loop synchronization system according to various embodiments of the invention. The $2^{nd}$ loop 420 comprises the phase frequency detector (PFD) 322, the charge pump (CP) 324, a loop filter (LF) 326 and the $1^{st}$ loop 310 (functioning as a VCO). Typically, the LF 326 is a low pass filter. The output 314 of the $1^{st}$ loop 310 is fed back as an input to the PFD 322. The PFD produces an error signal (output 323) which is proportional to phase difference between the output 314 of the $1^{st}$ loop 310 and the recovery clock 122. The output 323 then passes through the CP 324 and the LF 326 to drive the VCO to generate a final output 328 to be amplified by the amplifier 130.

The $2^{nd}$ Loop functions to lock the phase and the frequency of the oscillator with the recovery clock. The PFD 322 couples to the data baseband 110 to receive the data signal 112 comprising binary bits of 0 and 1. The $2^{nd}$ Loop is activated only during data zero (binary bits of 0) periods. During the initial period and the data zero period, TX output is not enabled (HZ mode), and both loops ($1^{st}$ and $2^{nd}$ loops) are activated in order to lock the frequency and the phase between TX clock and the incoming carrier.

In some embodiments, when the TX power amplifier (PA) is activated, the $2^{nd}$ loop is deactivated. The frequency and the phase of the relaxation oscillator 300 are kept at their previous states. The PFD 322 is disabled to open the $2^{nd}$ loop. Consequently, the operation of the relaxation oscillator 300 is not impacted by TX output, since the recovery clock is not taken during this period. The $1^{st}$ loop is still activated to filter out the phase noise generated by the relaxation oscillator.

In some embodiments, TX output is not enabled during a locking process. An additional buffer tracking the delay of the TX driver is incorporated between the VCO and the PFD. When the TX is enabled, the $2^{nd}$ locking loop is deactivated with the PFD disabled. The oscillation is kept its previous state and the phase during data one period to prevent the interference from the TX output driver.

In some embodiments, the Dual-Loop Synchronization system synchronizes the clock in tag/slave and reader/master by the $2^{nd}$ loop of the system during the period when the TX of the tag/slave does not transmit power, thus alleviating the Center Frequency Offset (CFO) between reader (Master/PCD) and tag (Slave/PICC), which is one of the biggest issues in wireless communication design and may ruin the entire communication without receiving any data.

In some embodiments, during the TX mode when tag/slave need to reply to reader/master, the $2^{nd}$ loop is disabled (open) to prevent the self-interference. The $1^{st}$ loop is still activated to guarantee low phase noise to transmit the data.

Although FIGS. 3 and 4 are shown with the exemplary schematic diagram for the Dual-Loop Synchronization system, one skilled in the art will recognize that various modifications and embodiments of the Dual-Loop Synchronization system may be practiced. The modifications may include additional components such as a frequency divider along feedback paths, different signal processing sequence arrangements, etc.

Figure 5:
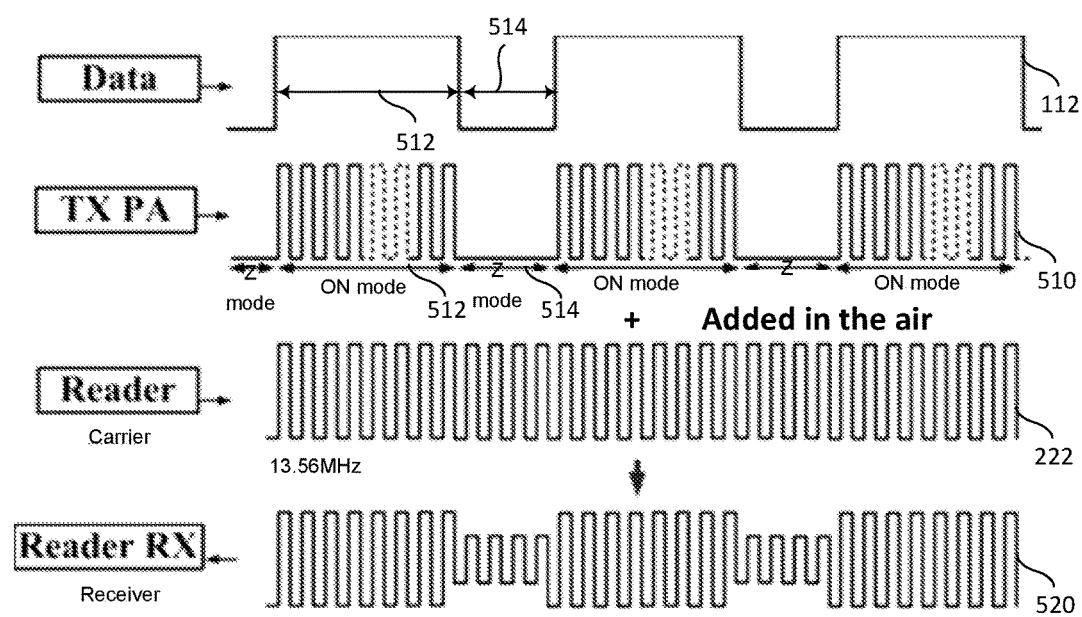
FIG. 5 is exemplary signal waveforms of the RF tag with a dual-loop synchronization system and the reader according to various embodiments of the invention.

FIG. 5 is exemplary signal waveforms of the RF tag with a dual-loop synchronization system and the reader according to various embodiments of the invention.

Similar to FIG. 2, signal 222 is the carrier sent by the reader 200. The baseband 110 outputs the signal 112 comprising binary bits of 0 and 1. The binary bits are sent sequentially with each bit occupying at least one clock period of the recovery clock signal 122. The time interval 512 corresponds to binary 1 period is data one interval and the time interval 514 corresponds to binary 0 period is data zero interval. Signal 510 corresponds to signal output from the PA 130 and to be transmitted by the transmitter antenna 140.

During data zero interval 514, the power amplifier 130 is set in a high impedance (HZ) mode (amplifier floating) and are not energized. Hence the signal 510 has no pulses corresponding data zero interval 514. During data one interval 512, the power amplifier 130 is set at a low power with a first setting (such as a lowest possible power setting) at the first clock cycle of data one interval to start up and then is set at an enhanced power with a second setting higher than the first setting to deliver an amplified signal during the rest clock cycles of data one interval. Therefore the signal 510 has amplified pulses corresponding data one interval 512. The reader 200 receives a reader receiving signal 520, which is the combination of the signal 510 and the carrier signal 222.

The foregoing description of the invention has been described for purposes of clarity and understanding. It is not intended to limit the invention to the precise form disclosed. Various modifications may be possible within the scope and equivalence of the application.

The invention claimed is:

1. A dual-loop phase lock loop (PLL) comprising:
   a first oscillator;
   a first loop comprising an operational transconductance amplifier (OTA), the first loop feeding an output of the first oscillator back into an input of the first oscillator; and
   a second loop feeding the output from the first oscillator back into an input of the OTA to lock phase and frequency of the first oscillator with a recovery clock extracted from a carrier transmitted by a reader.

2. The PLL of claim 1 wherein the first oscillator is a relaxation oscillator created from a comparator-based hysteretic oscillator with by positive feedback loop implementation for a comparator.

3. The PLL of claim 2 wherein in the first loop, the output of the relaxation oscillator is fed into a negative input of the OTA and the output from the OTA is fed back into a negative input of the comparator.

4. The PLL of claim 2 wherein the first loop functions as a voltage-controlled oscillator (VCO) and always enabled to filter out phase noise from the relaxation oscillator.

5. The PLL of claim 1 wherein the second loop comprises at least a phase frequency detector (PFD).

6. The PLL of claim 5 wherein the PFD receives a binary data signal from a data base band and the recovery clock signal to produce an error signal proportional to phase difference between an output of the first loop and the recovery clock.

7. The PLL of claim 6 wherein the second loop is activated only when the binary data signal is zero.

8. The PLL of claim 6 wherein the second loop further comprises a charge pump (CP) and a loop filter (LF), the error signal passing through the CP and the LF to drive the first loop to generate a final output from the PLL.

9. A method for synchronizing an output from a transmitter and a carrier transmitted by a reader, the method comprising:
   receiving, at the transmitter, the carrier from the reader;
   extracting a recovery clock from the carrier;
   producing an error signal, at a phase frequency detector (PFD), based at least on the recovery clock signal and an output signal from an oscillator, the error signal being proportional to phase difference between the output signal of the oscillator and the recovery clock, the PFD further receives a binary data signal from a data baseband storing transmitter identification information, the PFD being activated only when the binary data signal is zero;
   feeding the error signal back to the oscillator to generate a final output for amplification by an amplifier within the transmitter; and
   transmitting the amplified final output signal from the transmitter.

10. The method of claim 9 wherein oscillator is a voltage-controlled oscillator (VCO).

11. The method of claim 9 wherein the amplifier within the transmitter is not energized when the binary data signal is zero such that no pulse is transmitted from the transmitter.

12. The method of claim 9 wherein the amplifier is set at a low power with a first setting at a first clock cycle with the binary data signal being one for start-up.

13. The method of claim 12 wherein the amplifier is set an enhanced power with a second setting higher than the first setting to deliver an amplified signal during the rest clock cycles with the binary data signal being one.

14. The method of claim 9 wherein the VCO is enabled independent of the binary data signal state to filter out phase noise.

15. The method of claim 12 wherein the PFD is disabled when the amplifier being activated such that the VCO is locked at its previous state and phase.

16. A transmitter for near field communication (NFC) with a reader, the transmitter comprising:
   a voltage-controlled oscillator (VCO);
   a phase frequency detector (PFD) receiving an output from the VCO and a recovery clock signal extracted from a carrier transmitted by the reader, the PFD generating an error signal proportional to phase difference between the output of the VCO and the recovery clock, the error signal being fed back to the VCO for the generation of a final output, the PFD further receives a binary data signal from a data baseband storing transmitter identification information, the PFD being activated only when the binary data signal is zero; and
   an amplifier to amplify the final output to be transmitted from the transmitter.

17. The transmitter of claim 16 wherein the amplifier is not energized when the binary data signal is zero such that no pulse is transmitted from the transmitter.

18. The transmitter of claim 16 wherein the amplifier is set at a low power with a first setting at a first clock cycle with the binary data signal being one for start-up, wherein the amplifier is set an enhanced power with a second setting higher than the first setting to deliver an amplified signal during the rest clock cycles with the binary data signal being one.

* * * * *